United States Patent
Gutleber

[11] 4,027,264
[45] May 31, 1977

[54] PHASE LOCK LOOP MULTITONE INTERFERENCE CANCELING SYSTEM

[75] Inventor: Frank S. Gutleber, Little Silver, N.J.

[73] Assignee: The United States of America as represented by the Secretary of the Army, Washington, D.C.

[22] Filed: Feb. 24, 1976

[21] Appl. No.: 660,965

[52] U.S. Cl. .............................. 328/167; 325/476; 329/122; 329/133
[51] Int. Cl.² ......................................... H03D 3/24
[58] Field of Search .......... 325/474, 475, 476, 477; 328/165, 167; 329/122, 123, 124, 130, 133, 168, 170; 179/1 P

[56] References Cited
UNITED STATES PATENTS

| | | | |
|---|---|---|---|
| 3,440,540 | 4/1969 | Hane et al. | 329/122 X |
| 3,544,904 | 12/1970 | Eness | 325/476 |
| 3,603,890 | 9/1971 | Camenzind et al. | 329/122 X |
| 3,723,883 | 3/1973 | Renner | 325/476 |
| 3,916,320 | 10/1975 | Roll et al. | 328/165 X |

Primary Examiner—John S. Heyman
Attorney, Agent, or Firm—Nathan Edelberg; Daniel D. Sharp; Sheldon Kanars

[57] ABSTRACT

An interference canceling system in which a phase lock loop is utilized as a narrow band tracking filter to adaptively lock to interference tones to be canceled by a process of signal subtraction.

7 Claims, 2 Drawing Figures

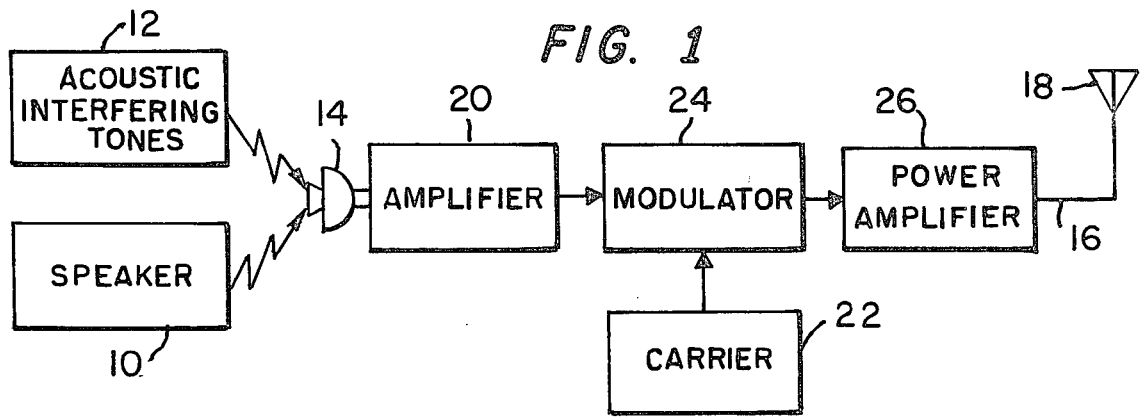

PHASE LOCK LOOP MULTITONE INTERFERENCE CANCELING SYSTEM

The invention described herein may be manufactured and used by or for the Government for governmental purposes without the payment of any royalties thereon or therefor.

FIELD OF THE INVENTION

This invention relates to interference canceling systems and, more particularly, to such a system in which continuous wave, or slowly varying continuous wave, interference is significantly reduced in communications applications.

BACKGROUND OF THE INVENTION

As is well known and understood, perhaps the most common method of reducing continuous wave interference is through the use of band pass notch filters. However, as applied in audio communications systems — and, especially, in audio avionics defense communications — the use of such filters are disadvantageous in certain respect. First of all, relatively large, and therefore expensive, inductors and capacitors are required for the passive, low frequency filtering. Secondly, the filtering also distorts the voice signal and deteriorates its intelligibility. Thirdly, the filtering is done around a pre-set frequency, affording the possibility of signal jamming merely by changing frequencies.

SUMMARY OF THE INVENTION

As will become clear hereinafter, the interference canceling system of the present invention employs a phase lock loop as a narrow band filter which, through its inherent utilization of resistors and capacitors, substantially reduces problems associated with any requirement for large value inductors. The phase lock loop, additionally, is used to permit voice signal information, for example, to be stripped from an interfering tone in yielding a signal-free duplicate of the interference; this duplicate can then be readily adjusted in amplitude and phase to permit linear subtraction of the interference from a composite input signal. Because the input voice signal is not filtered, it remains essentially free of distortion, to enhance the intelligibility of the output signal. As the phase lock loop can be set for individual interfering tones or can be swept, it can find extensive use in avionics communication — both where there is known multitone interference (as with acoustic helicopter noise having tendencies to degrade performance of on-board communications) and where the interference frequency can be changed, as in the context of signal jamming.

BRIEF DESCRIPTION OF THE DRAWING

These and other features of the present invention will be more clearly understood from a consideration of the following description, taken in connection with the accompanying drawing, in which:

FIG. 1 is a block diagram of a portion of an audio communications system helpful in an understanding of the invention; and FIG. 2 is a block diagram of a multitone interference canceling system constructed in accordance with the present invention, and useful in the communications system of FIG. 1.

DETAILED DESCRIPTION OF THE DRAWING

In FIG. 1, assumed to represent an audio communications system aboard a tactical defense helicopter, for example, voice intelligence from a speaker 10 (e.g. the pilot) is mixed within a microphone 14 with acoustic interfering tones (e.g. ambient rotor noise) from a source 12, for subsequent communication, either by cable 16, aboard the aircraft, or by antenna 18, to a ground station. An amplifier 20 amplifiers the detected microphone signals, which then modulate a carrier prior to further amplification and transmission. The carrier source 22, modulator 24 and power amplifier 26 may be of appropriate design. As will be apparent, the acoustic interfering tones tend to interfere with the voice intelligence whether the interference be continuous wave or slowly varying continuous wave, as long as it is within the same frequency band as the voice signal. Using a band pass notch filter to eliminate such acoustic interference would deteriorate the intelligibility of the voice signal.

However, in accordance with the invention, there are provided $n$ interference canceling phase lock loops in tandem between the demodulated signal output terminal 28 of a receiver 30 and the sound reproduction apparatus, typically a listener's earphones 32. Each phase lock loop, e.g. 34, 36, 38, etc., can be utilized as needed, and will independently synchronize as a very narrow band phase lock to one of the interfering tones. In applications where only a single interfering tone is to be canceled, only the phase lock loop 34 need be utilized. As the output of each interference canceler serves as the input to the next interference canceler (except for the $n$th canceler which couples to the earphones 32), optimum performance will follow if the number of phase lock loop arrangements equal the number of different interfering tones. To provide maximum anti-jamming capabilities, the number of interfering cancelers should be one more than the number of interfering tones, to protect against signal jamming which could result if yet an additional jamming tone were introduced.

In the direction that follows, it will be understood that each tone interference canceler is of identical construction, differing, if at all, substantially only when the individual loops are preset to search for known frequency tones, instead of being adaptively arranged to sweep to lock to unknown interference frequencies. In these arrangements, the voltage controlled oscillator 40 of each tone interference canceler would be set to operate at a different frequency.

Referring more specifically to the tone interference canceler 34, it will be seen that the voltage controlled oscillator 40 is part of a phase lock loop also including a phase detector 42 and a loop filter 44. When the loop locks to the interfering tone present in the signal coupled to the receiver 30, the output from oscillator 40 is applied, via a 90° phase shifter 46 to a second phase detector 48, whereat the output from terminal 28 is also applied. When the oscillator 40 locks to the interfering tones, the output of phase detector 48 will be a voltage, which is further filtered by an integrator 50 to provide a direct voltage output at terminal 52 indicating the loop has locked to an interference signal.

Also illustrated in the tone interference canceler 34 are a variable amplifier 54, a subtractor 56 and a null detector 58. As shown, the intelligence signal along with the interference tone is applied to the subtractor 56, to which is also coupled the output of amplifier 54 when a switch 60 is in the closed position. Such switch can be manually closed by the helicopter pilot upon noting the output voltage indication at terminal 52 that the loop is in lock (e.g., by an illuminated bulb), but can also be automatically closed in response to such direct voltage, as well. The output from the phase shifter 46 is applied to the variable amplifier 54 as an input, with the null detector 58 serving to adjust the setting of the variable amplifier until a null indication is presented with respect to the interference tone. In other words, the null detector 58 serves to adjust the amplitude of the supplied voltage controlled oscillator signal after it is locked in frequency and phase to the interference tone. The output from subtractor 56 will thus be devoid of the interference tone to which the loop 34 has locked, and can thereafter be applied as an input to the phase lock loop system 36 for subsequent extraction of any second, different interfering tone that might be present at the output terminal 28 of receiver 30.

As will be readily apparent, the foregoing discussion followed on the assumption that the voltage controlled oscillator was initially set to lock onto a known interfering tone. However, the phase lock loop and its oscillator could be arranged to be manually, or automatically, swept across the spectrum in search of an unknown frequency tone, as well. For example, any appropriate arrangement could be employed to vary the voltage on a capacitor of the voltage controlled oscillator, to vary its tank circuit and resultant frequency of oscillation in an attempt to lock onto an interfering tone.

To optimize the described operation, the design parameters should be selected to make the phase lock loop very narrow band, so as to reduce its lock-in, or pull-in, range and to further insure that little voice intelligence would be filtered out along with the interfering tone. If a wider bandwidth were employed, there would be a comparable reduction in the required sweep of the oscillator, but this would be at the sacrifice of performance because added intelligence information could be extracted from the received signal, as well as the interference tone. With present day designs, phase lock loops are readily available with closed loop bandwidths of less than 10 hz, so as to insure retaining synchronization in the presence of the intelligence information and such that substantially all of the voice signal energy would be filtered out in the phase lock loop. For the same reason only a small amount of information would be extracted, that being around the interference signal, so that the ultimate signal coupled to the listener's earphones would be essentially free of distortion.

It will also be apparent that the phase lock loop could be used for slowly varying continuous wave signals in addition to a continuous wave signal, whether the interference be audio in nature, electronic, or a jamming signal. As to the variations in continuous wave frequency, once the rapidity of the frequency variations falls within the frequency of the audio or other measured spectrum, some of the intelligence information could be lost—but this would be minimal if the rate of change of the interference falls outside the frequency of the audio spectrum. This is so even though the slow variations by large in magnitude. If the rate of change of frequency becomes too great, however, an increased bandwidth would be required in order to maintain lock, causing part of the signal intelligence to be lost and audio distortion in the output would result.

While there has been described what is considered to be a preferred embodiment of the present invention, it will be apparent that modifications may be made by those skilled in the art without departing from the scope of the teachings herein of utilizing a phase lock loop as a very narrow band tracking filter to enable stripping the voice signal from an interfering tone to yield a signal free duplicate of the interference, which could then be readily adjusted in amplitude and phase to enable linear subtraction from the composite signal. For at least those reasons, the scope of the invention should be read in light of the claims appended hereto.

I claim:

1. In a communication system for removing at least one undesired interfering continuous wave frequency from incoming wave energy including a wideband intelligence-bearing signal, an interference cancellation network for each said interfering frequency comprising:
   an ultra-narrow bandwidth phase lock loop continuously receptive of said input wave energy and capable of continuously tracking only said interfering continuous wave frequency,
   said phase lock loop including a voltage controlled oscillator which can be swept in frequency over the spectral range of the intelligence-bearing signal until the interfering frequency is encountered,
   said phase lock loop further including a phase detector coupled to said oscillator and to said incoming wave energy and a narrow band low pass filter.
   the output of said oscillator being a replica of said interfering continuous wave frequency, and
   circuit means responding to the output of said oscillator and to said incoming wave energy for canceling from said incoming wave energy said interfering continuous wave frequency only while said oscillator is frequency locked to the interfering frequency.

2. A system as recited in claim 1 wherein said incoming wave energy includes a plurality of interfering frequencies and comprising a like plurality of cascaded interference cancellation networks, each phase lock loop being set to lock on a different one of said interfering frequencies.

3. A system as set forth in claim 1 further including means for indicating that said phase lock loop has locked to said interfering frequency; and wherein said circuit means includes a 90° phase shifter and a variable amplifier responding to said 90° phase-shifted oscillator output,
   a subtractor coupled to said incoming wave energy, and
   means for coupling the output of said variable amplifier to said subtractor only while the lock condition is indicated.

4. A system as recited in claim 3 wherein said means for indicating includes phase detection means responsive to the 90° phase-shifted output of said oscillator and to said incoming wave energy and an integrator, said means for indicating providing a direct current voltages indicative of a lock to said interfering continuous wave frequency.

5. The system as recited in claim 4 including means for adjusting the gain of said amplifier to provide complete substraction of said interfering continuous wave frequency from said incoming wave energy while said phase lock condition is indicated.

6. A system as recited in claim 5 wherein said means for adjusting includes a null detector connected in the output of said subtractor and coupled to said amplifier.

7. The system as recited in claim 4 wherein the output of said means for indicating is representative of the level of said interfering frequency, and including means for adjusting the gain of said amplifier in accordance with the output of said means for indicating to provide complete cancellation of said continuous wave frequency from said incoming wave energy while said phase lock condition is indicated.

* * * * *